United States Patent
Pauk et al.

(10) Patent No.: US 10,642,303 B1
(45) Date of Patent: May 5, 2020

(54) FAST-ENABLE CURRENT SOURCE

(71) Applicant: NXP USA, Inc., Austin, TX (US)

(72) Inventors: Ondrej Pauk, Chandler, AZ (US); John Pigott, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/354,147

(22) Filed: Mar. 14, 2019

(51) Int. Cl.
  *G05F 3/20* (2006.01)
  *H03K 17/687* (2006.01)
  *G05F 1/56* (2006.01)

(52) U.S. Cl.
  CPC .............. *G05F 3/20* (2013.01); *G05F 1/56* (2013.01); *H03K 17/687* (2013.01)

(58) Field of Classification Search
  CPC .............. G05F 3/20; G05F 3/227; G05F 3/24
  See application file for complete search history.

(56) References Cited

U.S. PATENT DOCUMENTS

| | | | |
|---|---|---|---|
| 5,329,192 A | 7/1994 | Wu et al. | |
| 6,285,223 B1 * | 9/2001 | Smith | G05F 3/30 |
| | | | 327/143 |
| 8,237,376 B2 | 8/2012 | Franco | |
| 8,988,143 B2 * | 3/2015 | Berkhout | G05F 3/262 |
| | | | 327/543 |
| 9,244,479 B2 * | 1/2016 | Willey | G05F 3/262 |
| 9,312,747 B1 | 4/2016 | Svorc | |

* cited by examiner

*Primary Examiner* — Hai L Nguyen
(74) *Attorney, Agent, or Firm* — Charlene R. Jacobsen

(57) ABSTRACT

A method for fast-enabling a current source includes conducting a first current through a first branch including a first transistor connected in series with a first switch, in response to enabling the first switch with an enable signal. A first charge is removed from a bias rail with a first capacitance between a first gate and a first source of the first transistor. A second current is conducted through a second branch including a second switch connected in series with a second transistor, in response to enabling the second switch with the enable signal. A second charge is added to the bias rail with a second capacitance between a second drain and a second gate of the second transistor, wherein the first gate and the second gate are connected to the bias rail and biased by the mirror reference voltage.

20 Claims, 5 Drawing Sheets

FAST-ENABLE CURRENT SOURCE

FIELD

This disclosure relates generally to switchable current sources, and more specifically to a current source that can be quickly activated while minimizing settling time.

BACKGROUND

Low power integrated circuits ("ICs") frequently use groups of circuits or blocks that are enabled and disabled periodically to save power. For example, in a DC/DC power converter operating in a Pulse Frequency Modulation (PFM) mode, circuitry blocks are switched between active and inactive states each clock cycle. In general, these circuitry blocks include digital circuits that are switched on or off, and analog circuits having current sources that also are switched. For high performance analog circuits, requiring fast and stable response, these current sources must be switched on rapidly and settle to a stable value in a short period of time.

Previous attempts to address the issue of quickly enabling a current source have included the use of current steering circuits, which waste current and are not appropriate for low power circuitry. Another solution makes use of a closed-looped circuit, which can degrade the settling time of an output current and in certain cases consume a significant amount of quiescent power. Lastly, another previous solution uses large capacitors, which are area intensive, slow and often sensitive to loading conditions.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Various embodiments described herein provide for the fast enablement of a switched current source to minimize settling time and thereby more rapidly provide a stable and accurate current output. Specifically, the circuit and method of embodiments of this disclosure use two switched current branches, which are combined to provide a stable current source output, with negligible area increase and minimal impact to quiescent current. Each branch is referenced to a bias current branch, and includes either a switched drain or switched source of a respective transistor to offset charge removal on a bias line (e.g., a mirror reference), with charge injection occurring on the same bias line. Offsetting charge removal with charge injection, in whole or in part, includes designing the respective transistors on each branch to have an optimal transistor ratio. In one embodiment, the optimal transistor ratio is defined by the respective transistor widths, which in turn define respective parasitic capacitances of the transistors. Charge removal or injection occurs through these parasitic capacitances in response to respective transistors of the current branches being enabled.

Figure 1:
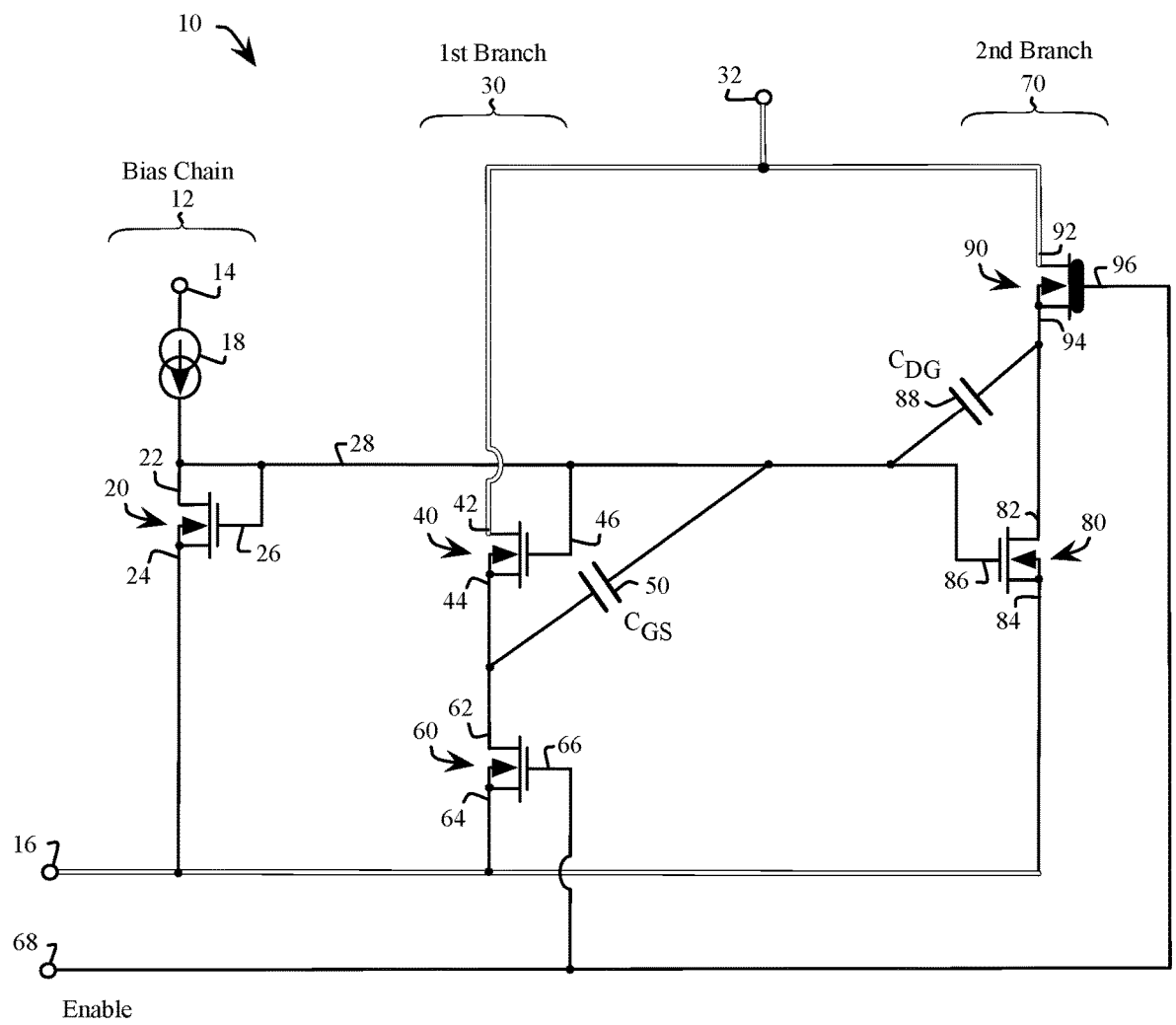
FIG. 1 is a schematic view of a fast-enable current source in accordance with an example embodiment of the present disclosure.

FIG. 1 shows an embodiment 10 of a fast-enable current source in accordance with the present disclosure. The embodiment 10 includes a bias chain 12 connected between a bias supply 14 and the second node 16. A current source 18 is connected between the bias supply 14 and a bias transistor 20. The bias transistor 20 comprises a bias drain 22 connected to the current source 18, a bias source 24 connected to a second node 16, and a bias gate 26 connected to the bias drain 22 and a bias rail 28.

The embodiment 10 further comprises a first branch 30 between a first node 32 and the second node 16. The first branch 30 includes a first transistor 40. The first transistor 40 includes a first drain 42 connected to the first node 32, a first source 44 connected to a first switch 60, and a first gate 46 connected to the bias rail 28. The first transistor 40 further includes a first capacitance 50 (CGS) between the first gate 46 and the first source 44. In some embodiments, the first capacitance 50 is a parasitic capacitance of the first transistor, and thus scales in proportion to a first width (e.g. channel width) of the first transistor 40. The first switch 60 includes a first switch drain 62 connected to the first source 44, a first switch source 64 connected to the second node 16, and a first switch gate 66 connected to an enable signal 68.

The embodiment 10 further comprises a second branch 70 between the first node 32 and the second node 16. The second branch 70 includes a second transistor 80. The second transistor 80 includes a second drain 82 connected to a second switch 90, a second source 84 connected to the second node 16, and a second gate 86 connected to the bias rail 28. In one embodiment, the second switch 90 comprises a high voltage transistor. The second transistor 80 further includes a second capacitance 88 (CDG) between the second drain 82 and the second gate 86. In some embodiments, the second capacitance 88 is a parasitic capacitance of the second transistor, and thus scales in proportion to a second width (e.g. channel width) of the second transistor 80. The second switch 90 includes a second switch source 94 connected to the second drain 82, a second switch drain 92 connected to the first node 32, and a first switch gate 96 connected to the enable signal 68.

The first branch 30 and the second branch 70 are mirrored to the bias chain 12 and complementarily compensate for voltage excursions on the bias rail 28, thereby resulting in faster settling time of the mirror reference voltage on the bias rail 28, with negligible overshoot. This compensation occurs because the first source 44 of the first branch 30 is switched negatively, thereby extracting charge from the bias rail 28 through the first capacitance 50, while the second drain 82 of the second branch 70 is switched positively, thereby adding or injecting charge to the bias rail 28 through the second capacitor 88. In one example, the embodiment 10 provides a 100 uA current through the first node 32, combined from the first branch 30 and the second branch 70, which settles to an acceptable level within 10 nanoseconds.

With appropriate partitioning of the sizes, voltage swings and parasitic capacitances of the two branches, the charge removal from the bias rail 28 by the first branch 30 will substantially offset the charge addition to the bias rail 28 by the second branch 70. This appropriate partitioning defines an optimal transistor ratio between the first transistor 40 and the second transistor 80. In one example embodiment, the optimal transistor ratio is determined by the first width of the first transistor 40 being approximately one half of the second width of the second transistor 80. In one example, the first transistor 40 comprises 16 instances of a transistor connected in parallel, while the second transistor 80 comprises 33 instances of the same transistor size connected in parallel. In this context, being "connected in parallel" means that each of the drains are connected together, each of the sources are connected together, and each of the gates are connected together. Determination of the optimal transistor ratio is process specific and is determinable through simulations or by determining the resulting parasitic capacitances 50 and 88 for the first transistor 40 and the second transistor 80 respectfully, from the fabrication process parameters.

When the enable signal 68 is deactivated, the first switch 60 and the second switch 90 are deactivated (e.g., "off"). In response to the first switch 60 being deactivated, the first source 44 rises to a value approximately equal to one threshold (e.g., the VTH of the first transistor 40) below the mirror reference voltage on the bias rail 28. This occurs because the first transistor 40 continues to conduct until the gate to source voltage equals the threshold voltage of the first transistor 40. For brevity we will also refer to the mirror reference voltage as "nbias." In response to the second switch 90 being deactivated, the second drain 82 discharges to the potential of the second node 16, (zero volts in one example). This occurs because the second transistor 80 continues to conduct current with the nbias applied to the second gate 86. Accordingly, the first capacitor 50 (CGS) is charged to approximately VTH (e.g., the threshold voltage of the first transistor 40), and the second capacitor 88 (CDG) is charged to nbias.

When the enable signal 68 is activated, the first switch is activated, thereby driving the first source 44 to the potential of the second node 16 (e.g., zero volts in one example), and causing the first transistor 40 to conduct current. Activation of the first switch 60 thus removes charge from the bias rail 28 through capacitive coupling of the first capacitor 50. The charge removed is equal to CGS*(nbias−VTH). Concurrently, the second switch 90 is enabled, thereby clamping the second drain 82 to within one threshold voltage VTH2 (of the second switch 90 which may be different from the threshold voltage of the first switch 60) of the potential of the first node 32 (VDD in one example), and causes the second transistor 80 to conduct current. Activation of the second switch 90 thus adds charge to the bias rail 28 through capacitive coupling of the second capacitor 88. The charge added is equal to CDG*(VDD−VTH2). By selecting the optimal transistor ratio (and thus defining the values of CGS and CDG), the net charge removed and added on the bias rail 28 will be substantially zero. This condition occurs when CGS*(nbias−VTH) equals CDG*(VDD−VTH2).

Figure 2:
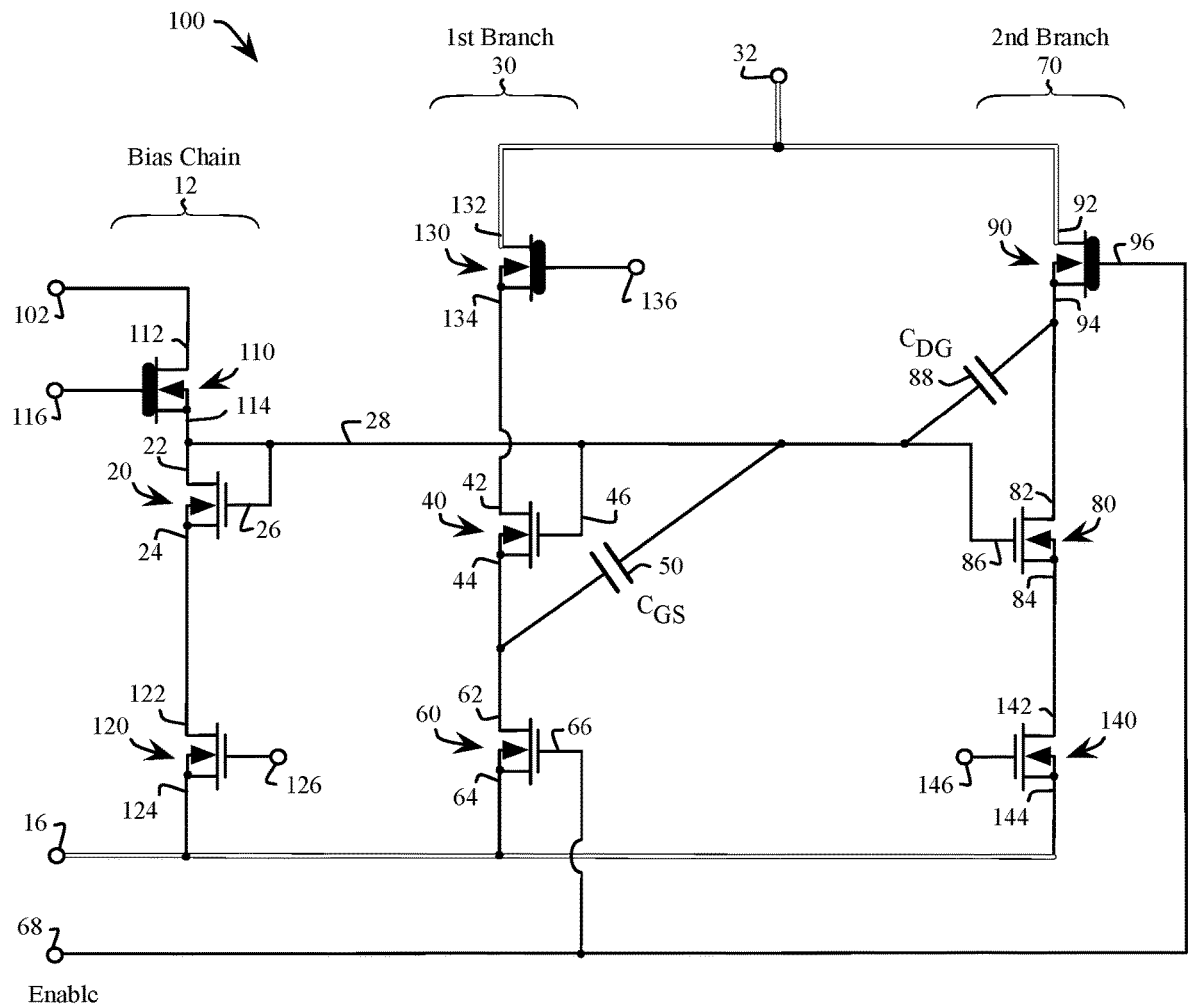
FIG. 2 is a schematic view of a fast-enable current source in accordance with an example embodiment of the present disclosure.

Referring now to FIG. 2, with continued reference to FIG. 1, an embodiment 100 of a fast-enable current source in accordance with the present disclosure is described. The operation of the embodiment 100 of FIG. 2 is similar to the operation of the embodiment 10 with additional transistors to improve the parasitic resistive balance between the bias chain 12, the first branch 30 and the second branch 70 by compensating for the channel resistance of activated transistors (e.g., the "RDSon" value). The bias chain 12 of the embodiment 100 includes a bias supply transistor 110 connected between a bias supply 102 and the bias rail 28. The bias supply transistor 110 includes a bias supply drain connected to the bias supply 102, a bias supply source 114 connected to the bias rail 28 and a bias supply gate 116, biased with a bias supply transistor voltage to supply a current from the bias supply 102 to the bias rail 28, similar to the current source 18 of FIG. 1. In another embodiment, the bias chain 12 of FIG. 1 is used with the first branch 30 and the second branch 70 of FIG. 2.

The bias chain 12 of embodiment 100 further includes a bias compensation device 120. The bias compensation device 120 includes a bias compensation drain 122 connected to the bias transistor source 24, a bias compensation drain 124 connected to the second node 16, and a bias compensation gate 126 connected to a bias compensation voltage equal to VDD (e.g., the high voltage on the enable signal 68), wherein the bias compensation device 120 is designed to have the same voltage drop (e.g., current*RDSON) as the first switch 60 when the first switch 60 is enabled. In one embodiment, VDD is 1.5 volts.

The first branch 30 of embodiment 100 further includes a protection device 130. The protection device 130 includes a protection drain 132 connected to the first node 32, a protection source 134 connected to the first drain 42, and a protection gate 136 connected to VDD, wherein the protection device 130 is designed to have the same voltage drop (e.g., current*RDSON) as the second switch 90 when the second switch 90 is enabled.

The second branch 70 of embodiment 100 further includes a compensation device 140. The compensation device 140 includes a compensation drain 142 connected to the second source 84, a compensation source 144 connected to the second node 16, and a compensation gate 146 connected to VDD, wherein the compensation device 140 is designed to have the same voltage drop (e.g., current*RDSON) as the first switch 60 when the first switch 60 is enabled. In one embodiment, achieving the same voltage drop across the compensation device 140 and the first switch 60 is achieved by scaling a relative size of the compensation device 140 compared to the first switch 60 to be the same as the relative size of the second transistor 80 compared to the first transistor 40 (e.g., 2:1 in one example).

In one embodiment, each of the transistors of embodiment 100 are N-channel Field Effect Transistors (NFETs). In one embodiment, the bias supply transistor 110, the protection device 130 and the second switch 90 are high voltage NFETs. In another embodiment, the bias compensation voltage, the first voltage and the second voltage are each equal to VDD. In another embodiment, one or more of the bias compensation device 120, the protection device 130 and the compensation device 140 are included in the fast-enable current source.

Figure 3:
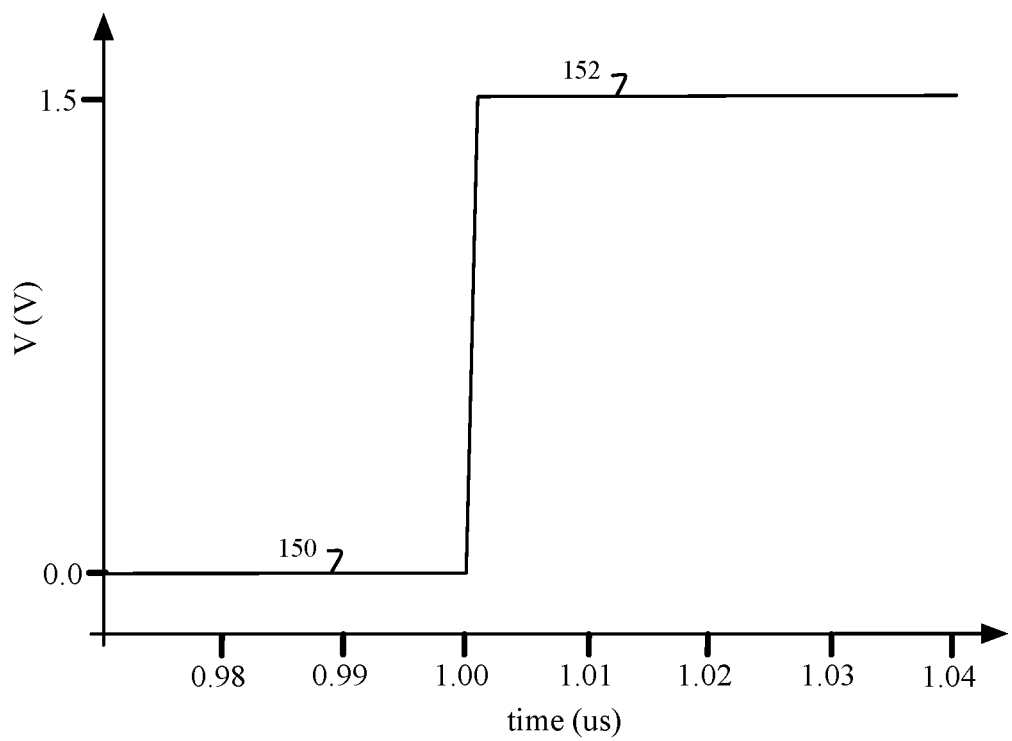
FIG. 3 is a graphical view of a timing waveform of an enable signal using the embodiment of FIG. 2.
Figure 4:
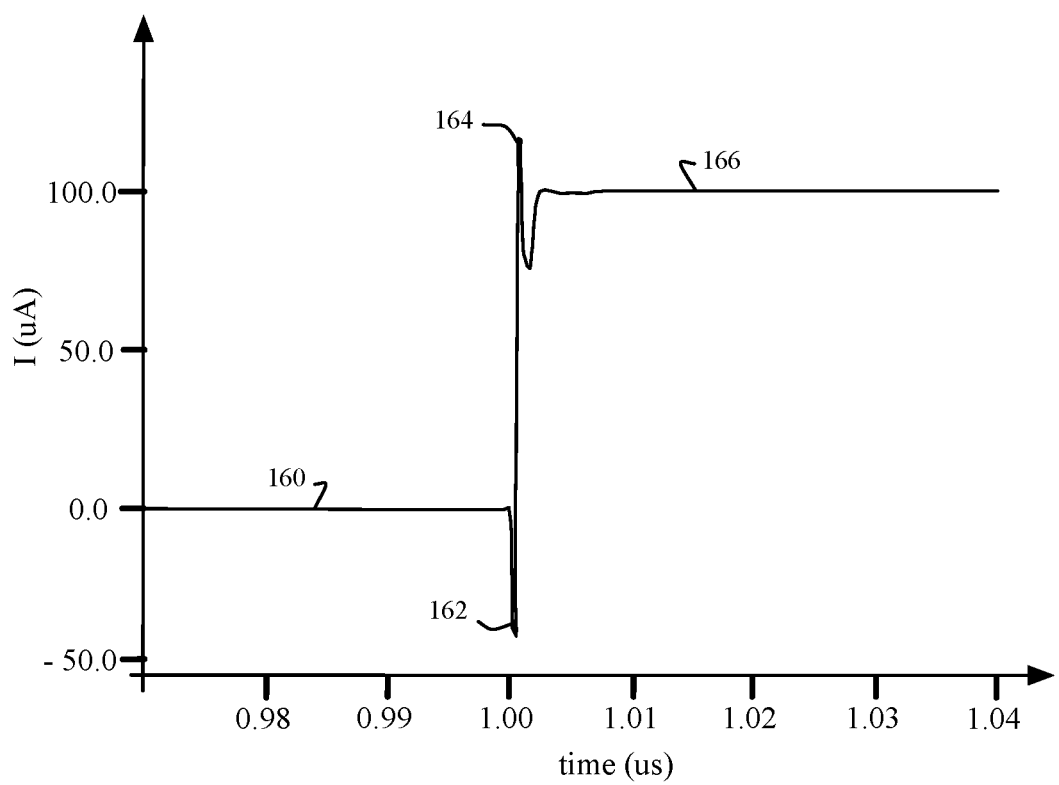
FIG. 4 is a graphical view of timing waveforms of generated currents using the embodiment of FIG. 2.

FIG. 3 and FIG. 4 show example timing waveforms for the embodiment 100 of FIG. 2. It should be understood that the timing shown in FIG. 3 and FIG. 4 similarly applies to the embodiment 10 of FIG. 1. FIG. 3, with reference to FIG. 2, shows the activation of the enable signal 68, to enable the fast-enable current source 100. Beginning at one microsecond, the enable signal 68 transitions from a low state 150 to a high state 152.

FIG. 4, with reference to FIG. 2 and FIG. 3, shows an output current that flows through the first node 32 in response to the enable signal 68 being activated. Specifically, the output current flowing into the first node 32, starts at substantially 0 uA at a quiescent level 160. In response to charge being removed from the bias rail 28 through the first capacitor 50, the output current may undershoot to an undershoot level 162. In one embodiment, in response to charge being added to the bias rail 28 through the second capacitor 88, the output current overshoots to an overshoot level 164, and then quickly settles to an active level 166 of 100 uA, shown in FIG. 4 to occur within 3 ns. The timing of FIG. 4 is an example to illustrate the interaction of the charge removal and addition to the bias rail 28. It should be understood, that in other embodiments, the undershoot level 162 and the overshoot level 164 may slightly lead, slightly lag due to typical manufacturing and environmental variations, but are closely timed to minimize any resulting voltage changes to the bias rail 28.

Figure 5:
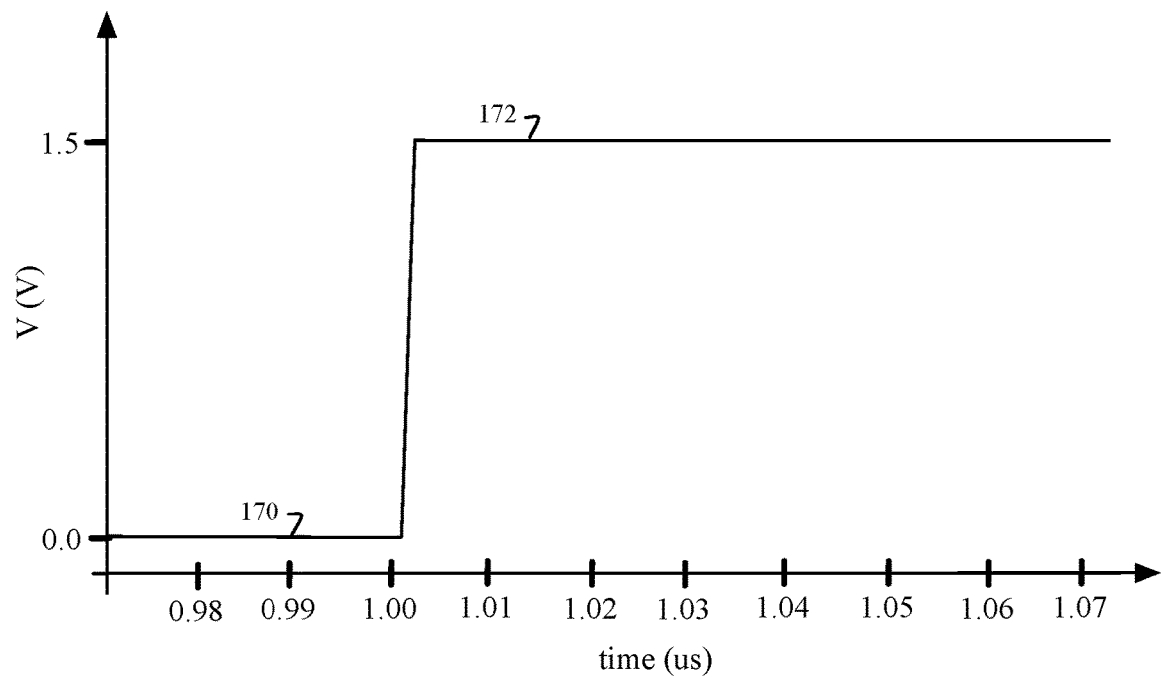
FIG. 5 is a graphical view of a timing waveform of an enable signal without using a fast-enable current source.
Figure 6:
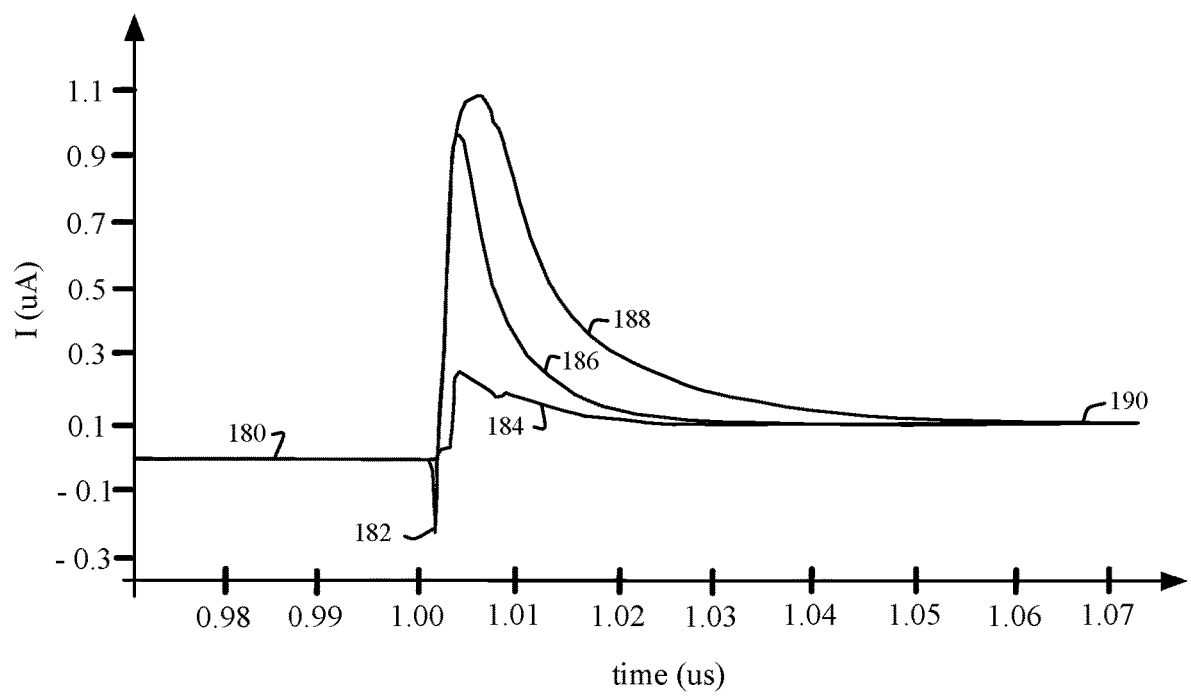
FIG. 6 is a graphical view of timing waveforms of generated currents without using a fast-enable current source.

FIG. 5 and FIG. 6 show example timing waveforms of an embodiment not using a fast-enable current source. Similar to FIG. 3, FIG. 5 shows a transition of an enable signal from a low state 170 to a high state 172 at one microsecond, to active a current source. In contrast to FIG. 4, FIG. 6 shows an output current having significant overshoot on a bias rail used to mirror a mirror reference voltage. Typically, the bias rail 28 of FIG. 1 or FIG. 2 may be long routing lines on large integrated circuits that substantially increases a bias rail parasitic capacitance (not shown). This bias rail parasitic capacitance significantly affects the performance of a switchable current source resulting in slow settling time or unstable compensation techniques. The embodiment 10 of FIG. 1 and embodiment 100 of FIG. 2 are independent of the bias rail parasitic capacitance.

In FIG. 6, the output current begins at a quiescent level 180. In response to an enable signal, the output may undershoot to an undershoot level 182, and significantly overshoot to overshoot levels 184, 186, 188, corresponding to bias rail parasitic capacitances of 50 fF, 200 fF and 500 fF respectively. Ultimately the output settles to an active level 190. FIG. 6 shows a current overshoot of up to ten times that of what is achieved in FIG. 4, due to routing length of the bias rail 28 and a circuit and method that are sensitive to bias rail parasitic capacitance. Even with shorter routing lengths of the bias rail 28, the overshoot level 184 is 100 percent of the overshoot level 164 of FIG. 4 and settling time exceeds 20 nanoseconds.

Figure 7:
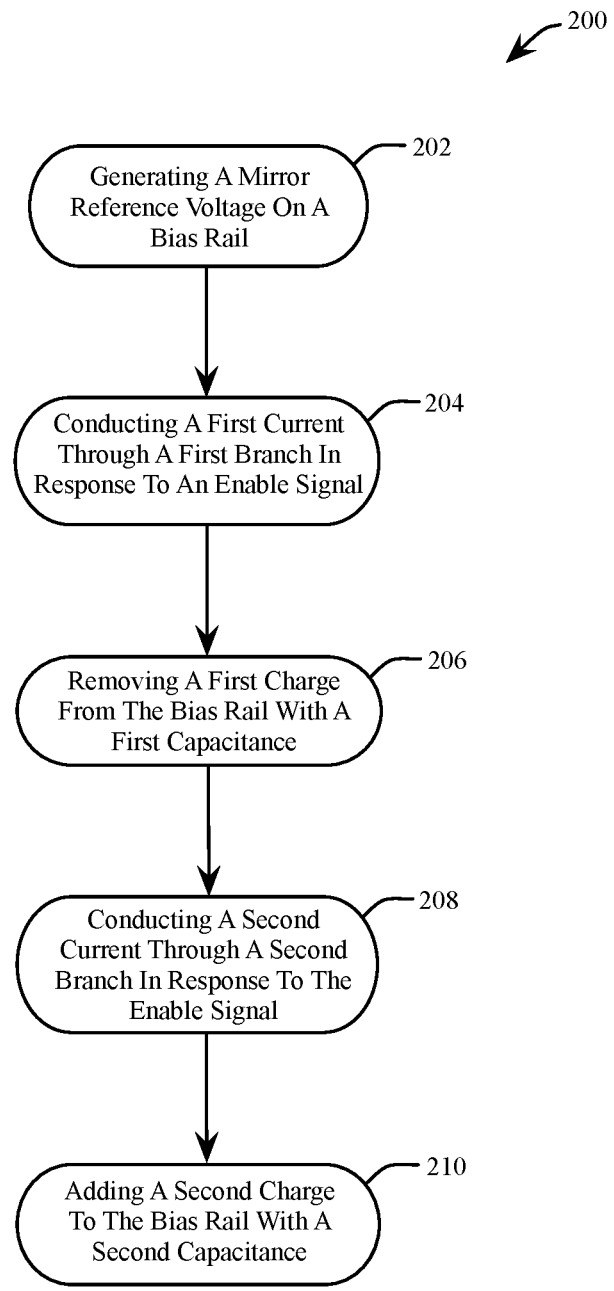
FIG. 7 is flowchart representation of a method for generating a fast-enable current source in accordance with an example embodiment of the present disclosure.

FIG. 7 is a flowchart view of a method 200 for fast-enabling a current source in accordance with an example embodiment of the present disclosure. With continued reference to FIG. 2 and FIG. 7, at 202, a mirror reference voltage is generated on a bias rail 28. At 204, a first current is conducted through a first branch 30 in response to an enable signal 68. At 206, a first charge (e.g., CGS*(nbias−VTH)) is removed from the bias rail 28 with a first capacitance 50. At 208, a second current is conducted through a second branch 70 in response to the enable signal 68. At 210, a second charge (e.g., CDG*(VDD−VTH2)) is added to the bias rail 28 with a second capacitance 88, thereby substantially cancelling any change in net charge on the bias rail 28 as result of the enable signal 68 enabling the fast-enable current source 100 (or embodiment 10 of FIG. 1). It should be understood that in various embodiments, 204, 206, 208 and 210, (and in particular 206 and 210), occur substantially at the same time. While minor timing misalignment, in particular with 206 and 210, may occur due to typical manufacturing and environmental variations, closely aligning 206 to 210, reduces undesirable overshoots and undershoots on the bias rail 28.

As will be appreciated, embodiments as disclosed include at least the following. In one embodiment, a fast-enable current source comprises a bias chain configured to generate a mirror reference voltage on a bias rail. A first branch comprises a first transistor having a first drain connected to a first node, a first source connected to a first switch, and a first gate connected to the bias rail. The first switch is configured to short the first source to a second node in response to an enable signal. A first capacitance is between the first gate and the first source. A second branch comprises a second transistor having a second drain connected to a second switch, a second source connected to the second node, and a second gate connected to the bias rail. The second switch is configured to short the second drain to the first node in response to the enable signal. A second capacitance is between the second drain and the second gate, wherein in response to the enable signal, a first charge removed from the bias rail by the first capacitor is offset by a second charge added to the bias rail by the second capacitor.

In another embodiment, a method for fast-enabling a current source comprises generating a mirror reference voltage on a bias rail. A first current is conducted through a first branch between a first node and a second node. The first branch comprises a first transistor connected in series with a first switch, in response to enabling the first switch with an enable signal. A first charge is removed from the bias rail with a first capacitance between a first gate and a first source of the first transistor, wherein the first gate is biased by the mirror reference voltage. A second current is conducted through a second branch between the first node and the second node. The second branch comprises a second switch connected in series with a second transistor, in response to enabling the second switch with the enable signal. A second charge is added to the bias rail with a second capacitance between a second drain and a second gate of the second transistor, wherein the second gate is biased by the mirror reference voltage.

In another embodiment, a fast-enable current source comprises a first branch comprising a first transistor having a first drain connected to a protection device, a first source connected to a first switch, and a first gate connected to a bias rail. The protection device is connected to a first node. The first switch is configured to short the first source to a second node in response to an enable signal. A first parasitic capacitance is between the first gate and the first source. A second branch comprises a second transistor having a second drain connected to a second switch, a second source connected to a compensation device, and a second gate connected to the bias rail. The compensation device is connected to the second node. The second switch is configured to short the second drain to the first node in response to the enable signal. A second parasitic capacitance is between the second drain and the second gate, wherein in response to the enable signal, a first charge removed from the bias rail by the first capacitor is offset by a second charge added to the bias rail by the second capacitor.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A fast-enable current source comprising:
   a bias chain configured to generate a mirror reference voltage on a bias rail;
   a first branch comprising a first transistor having a first drain connected to a first node, a first source connected to a first switch, and a first gate connected to the bias rail, the first switch configured to short the first source to a second node in response to an enable signal;
   a first capacitance between the first gate and the first source;
   a second branch comprising a second transistor having a second drain connected to a second switch, a second source connected to the second node, and a second gate connected to the bias rail, the second switch configured to short the second drain to the first node in response to the enable signal; and
   a second capacitance between the second drain and the second gate, wherein in response to the enable signal, a first charge removed from the bias rail by the first capacitor is offset by a second charge added to the bias rail by the second capacitor.

2. The fast-enable current source of claim 1 wherein the first charge equals the second charge, and a first width of the first transistor divided by a second width of the second transistor defines an optimal transistor ratio.

3. The fast-enable current source of claim 2 wherein the optimal transistor ratio is one half, wherein each of the transistors of the fast-enable current source comprise n-channel field effect transistors.

4. The fast-enable current source of claim 1 wherein the first switch comprises an n-channel field effect transistor comprising a first switch drain connected to the first source, a first switch gate connected to the enable signal configured to enable the first switch, and a first switch source connected to the second node.

5. The fast-enable current source of claim 1 wherein the second switch comprises a high-voltage n-channel field effect transistor comprising a second switch drain connected to the first node, a second switch gate connected to the enable signal configured to enable the second switch, and a second switch source connected to the second drain.

6. The fast-enable current source of claim 1 wherein the bias chain comprises a bias transistor comprising a bias drain connected to a current source, a bias gate connected to the bias drain and the bias rail, and a bias source connected to the second node.

7. The fast-enable current source of claim 6 further comprising a bias compensation device connected between the bias source and the second node, wherein the bias compensation device has a same voltage drop as the first switch when the first switch is enabled.

8. The fast-enable current source of claim 1 further comprising a protection device connected between the first node and the first drain, wherein the protection device has a same voltage drop as the second switch when the second switch is enabled.

9. The fast-enable current source of claim 1 further comprising a compensation device connected between the second source and the second node, wherein the compensation device has a same voltage drop as the first switch when the first switch is enabled.

10. The fast-enable current source of claim 1 wherein the first capacitance is a first parasitic capacitance of the first transistor, and the second capacitance is a second parasitic capacitance of the second transistor.

11. A method for fast-enabling a current source comprising:
    generating a mirror reference voltage on a bias rail;
    conducting a first current through a first branch between a first node and a second node, the first branch comprising a first transistor connected in series with a first switch, in response to enabling the first switch with an enable signal;
    removing a first charge from the bias rail with a first capacitance between a first gate and a first source of the first transistor, wherein the first gate is biased by the mirror reference voltage;
    conducting a second current through a second branch between the first node and the second node, the second branch comprising a second switch connected in series with a second transistor, in response to enabling the second switch with the enable signal; and
    adding a second charge to the bias rail with a second capacitance between a second drain and a second gate of the second transistor, wherein the second gate is biased by the mirror reference voltage.

12. The method of claim 11 further comprising determining an optimal transistor ratio by dividing a first width of the first transistor by a second width of the second transistor, wherein the optimal transistor ratio results in the first charge being equal to the second charge.

13. The method of claim 12 wherein determining the optimal transistor ratio results in the first width being half of the second width, wherein each of the transistors of the current source comprises n-channel field effect transistors.

14. The method of claim 11 further comprising compensating for an impedance of the second switch with a protection device between the first node and the first drain, wherein the protection device has a same voltage drop as the second switch when the second switch is enabled.

15. The method of claim 11 further comprising compensating for an impedance of the first switch with a compensation device between the second source and the second node, wherein the compensation device has a same voltage drop as the first switch when the first switch is enabled.

16. The method of claim 11 wherein generating the mirror reference voltage comprises sourcing a current through a bias transistor comprising a bias drain connected to a current source, a bias gate connected to the bias drain and the bias rail, and a bias source connected to the second node.

17. The method of claim 16 further comprising compensating for an impedance of the first switch with a bias compensation device connected between the bias source and the second node, wherein the bias compensation device has a same voltage drop as the first switch when the first switch is enabled.

18. A fast-enable current source comprising:
    a first branch comprising a first transistor having a first drain connected to a protection device, a first source connected to a first switch, and a first gate connected to a bias rail, the protection device connected to a first node, the first switch configured to short the first source to a second node in response to an enable signal;
    a first parasitic capacitance between the first gate and the first source;
    a second branch comprising a second transistor having a second drain connected to a second switch, a second source connected to a compensation device, and a second gate connected to the bias rail, the compensation device connected to the second node, the second switch configured to short the second drain to the first node in response to the enable signal; and a second parasitic capacitance between the second drain and the second gate, wherein in response to the enable signal, a first charge removed from the bias rail by the first capacitor is offset by a second charge added to the bias rail by the second capacitor.

19. The fast-enable current source of claim 18 wherein the protection device has a same voltage drop as the second switch when the second switch is enabled.

20. The fast-enable current source of claim 18 wherein the compensation device has a same voltage drop as the first switch when the first switch is enabled.

* * * * *